United States Patent [19]

Maracas et al.

[11] Patent Number: 5,669,303

[45] Date of Patent: Sep. 23, 1997

[54] APPARATUS AND METHOD FOR STAMPING A SURFACE

[75] Inventors: George N. Maracas, Phoenix; Lawrence N. Dworsky, Scottsdale; Kathleen Tobin, Tempe, all of Ariz.

[73] Assignee: Motorola, Schaumburg, Ill.

[21] Appl. No.: 610,776

[22] Filed: Mar. 4, 1996

[51] Int. Cl.[6] ............................................. B41F 31/00
[52] U.S. Cl. ...................................... 101/327; 101/41
[58] Field of Search ....................... 101/327, 41; 33/614, 33/616, 622

[56] References Cited

U.S. PATENT DOCUMENTS

| | | | |
|---|---|---|---|
| 3,096,713 | 7/1963 | McLaughlin, Jr. | 33/622 |
| 3,259,063 | 7/1966 | Rothman | 101/405 |
| 4,805,529 | 2/1989 | Becher | 101/333 |
| 5,512,131 | 4/1996 | Kumar et al. | 156/655.1 |
| 5,537,927 | 7/1996 | Rogovein et al. | 33/614 |

FOREIGN PATENT DOCUMENTS

| | | | |
|---|---|---|---|
| 472796 | 9/1937 | United Kingdom | 101/41 |

Primary Examiner—Edgar S. Burr
Assistant Examiner—Daniel J. Colilla
Attorney, Agent, or Firm—Eugene A. Parsons

[57] ABSTRACT

An apparatus (100) including a support structure (104), a flexible stamp (106) having a stamping surface (110) including a predetermined pattern disposed opposite the support structure (104), a pressure controlled chamber (112) disposed above the support structure (104), and a mechanical attachment (114) affixed to the flexible stamp (106). A method is provided for stamping the surface (101) of an article (102) including the steps of i) placing the article (102) on the support structure (104) within the pressure-controlled chamber (112), ii) wetting the stamping surface (110) with a solution containing a self-assembled monolayer-forming molecular species, iii) aligning alignment patterns (118) on the flexible stamp (106) with alignment patterns (124) on the surface (101) of the article (102), iv) controllably contacting the wetted stamping surface (110) with the surface (101) of the article (102) by changing the pressure differential across the flexible stamp (106) so that contact commences at the center of the flexible stamp (106) and proceeds outwardly in a controlled manner, and v) removing the stamping surface (110) from the surface (101) of the article so that a self-assembled monolayer (134) having the predetermined pattern is formed on the surface (101) of the article (102).

12 Claims, 4 Drawing Sheets

APPARATUS AND METHOD FOR STAMPING A SURFACE

FIELD OF THE INVENTION

The present invention pertains to the areas of microelectronic devices, sensors, and optical elements and more particularly to an apparatus and method for stamping the surface of an article in a reproducible and uniform fashion.

BACKGROUND OF THE INVENTION

Prior art methods of patterning (etching or plating) surfaces with micron or sub micron features include irradiative lithographic methods such as photolithography, electron-beam lithography, and x-ray lithography. The equipment used in conventional irradiative lithographic methods do not easily form large-area devices; they are limited to the fabrication of small-area devices which must subsequently be stitched together if a large-area device is to be fabricated. Typically, the largest area field that can presently be fabricated by a panel printer has a maximum area of about 12 in$^2$, and a typical photolithographic printer for semiconductor applications has a field area on the order of 1 in$^2$. The stitching process is costly and time-consuming.

Accordingly, there exists a need for an improved apparatus and method for patterning a surface which easily, economically and reproducibly aligns and prints large-area devices, thereby providing high throughput.

Photolithographic aligners are known in the art. They are designed to align hard masks, which are rigid and planar. This is accomplished by aligning one or more alignment patterns on the hard mask with the corresponding one or more alignment patterns on the surface to be patterned. Thus, the pattern on the mask is brought into registration with the pattern on the surface. The alignment is accomplished by making the necessary displacements of the entire hard mask. Since the hard mask is not deformable, it does not tend to bow or otherwise mechanically distort in a manner which can distort the pattern of the mask.

The alignment and contact printing process in photolithographic equipment includes several steps. The mask is placed in a photomask holder. The article to be patterned, or wafer, is placed on a vacuum chuck, which includes a plate having holes in it. When the article is placed on a surface of the vacuum chuck, it is held in place by suction through the holes in the plate. The hard mask is then positioned above, and parallel to, the wafer, within several hundred microns. A prealignment is performed wherein one or more alignment patterns on the hard mask are brought into registration with one or more corresponding alignment patterns on the surface of the article. Depending on the geometry of the corresponding patterns, one or two pairs of alignment patterns are sufficient to bring the stamp printing pattern into registration with the overall wafer pattern. One or two pairs of alignment patterns are sufficient to provide alignment regardless of the size of the mask because the mask is rigid. The alignment is accomplished by detecting the relative positions of the alignment patterns and making the necessary adjustments in the position of the hard mask and/or wafer by making x-y adjustments and angular/rotational adjustments in position. Alignment detection is achieved by using an alignment microscope. One or, at most, two alignment microscopes are included to detect alignment of the pair(s) of alignment patterns. When alignment is achieved, the hard mask and article are brought into contact. The printing gap between the mask and wafer is about 0–50 micrometers: hard contact is achieved by providing a high vacuum between the mask and wafer; soft contact is achieved by providing a low vacuum, about 50–500 mm Hg. It is recognized in the art that abrupt pressure change to vacuum conditions can trap gas between the mask and wafer. However, the solution is generally a step change from large-gap/high-pressure to soft-contact/low pressure followed by a delay for gas release through a valve; thereafter, hard-contact/vacuum are provided by dialing in the desired distance and, optionally, by flowing a stream of inert gas, at a given flow rate, from the underside of the wafer on the wafer chuck. These step changes in the distance between the wafer and mask, and in the pressure of the gas between them, are sufficient to prevent gas bubble formation between a hard mask and wafer.

As described above, prior art hard mask aligners provide contact between the hard mask and wafer by providing step changes in the distance and pressure between the mask and wafer. If this method is utilized to contact a deformable, flexible stamp with a surface of an article, gas bubbles will form between the surface of the stamp and the surface of the article. A prior art aligner would fail to properly align or contact a flexible stamp in a stamping process, resulting in non reproducible and non uniform printing. However, to be of any practical use, a stamping technique needs to provide reproducibility and uniformity.

Accordingly, there exists a need for an improved apparatus and method for aligning a flexible stamp with the surface of an article and for stamping the surface so that the pattern on the flexible stamp is transferred reproducibly and uniformly.

Micro-contact printing of self-assembled molecular monolayers (SAMs) is known in the art. The SAMs are comprised of molecules which have a functional group that binds to certain types of solids, and the remainder of the molecule (usually a long-chained hydrocarbon) interacts with neighboring molecules to form a dense structure which is impenetrable by certain chemical species. Current micro-contact printing methods for producing a SAM on a surface cannot reliably or reproducibly print surfaces, particularly large-area surfaces having surface areas greater than about 1 in$^2$.

Accordingly, another purpose of the present invention is to provide a cost-effective, reproducible method for patterning large-area surfaces.

BRIEF DESCRIPTION OF THE DRAWINGS

Referring to the drawings.

DESCRIPTION OF THE PREFERRED EMBODIMENTS

Figure 1:
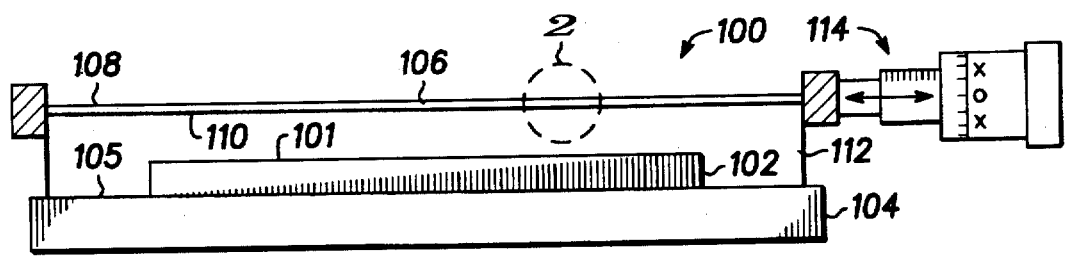
FIG. 1 is a side elevational view of an embodiment of an apparatus for stamping a surface of an article in accordance with the present invention.

Referring now to FIG. 1 there is depicted a side elevational view of an embodiment of an apparatus 100 for stamping a surface 101 of an article 102 in accordance with the present invention. Apparatus 100 includes a flexible stamp 106 having an outer surface 108 and a stamping surface 110. In an embodiment of a method for stamping surface 101 of article 102 in accordance with the present invention, apparatus 100 forms a self-assembled monolayer (SAM) on surface 101, as will be described in greater detail below. A general description of SAMs and flexible stamps suitable for use within apparatus 100 are described in co-pending U.S. patent application entitled "Apparatus and Method for Patterning a Surface", filed on even date herewith, by Maracas, et al, and being assigned to the same assignee, said application being incorporated herein by reference. Embodiments of the stamp disclosed in the above application can be incorporated into the embodiments of the present invention, thereby providing, for example, flexible stamp 106. Apparatus 100 further includes, as illustrated in FIG. 1, a support structure 104 having a surface 105, a first pressure controlled chamber 112, and a mechanical attachment 114. Support structure 104 includes a hard platform and is designed so that article 102 can be positioned on surface 105 and within pressure-controlled chamber 112. Flexible stamp 106 is positioned above support structure 104 so that stamping surface 110 opposes surfaces 105 and 101. Stamping surface 110 and surface 105 are positioned within first pressure-controlled chamber 112, which includes an enclosed region being operably connected to pressure-controlling apparati (not shown), which are known to those skilled in the art. The pressure within pressure-controlled chamber 112 can be controlled and manipulated to provide the desired contacting between flexible stamp 106 and surface 101, as will be described in greater detail below with reference to FIGS. 10-12. Mechanical attachment 114 is attached to flexible stamp 106 at the edges for positioning and securing flexible stamp 106. Mechanical attachment 114 can translate and rotate flexible stamp 106 during an alignment step, as will be described in greater detail below. Mechanical attachment 114 is also utilized to mechanically deform (stretch or compress) flexible stamp 106 during alignment. Specific configurations and elements of mechanical attachment 114 will occur to one skilled in the art and include, for example, "micrometers", similar to those employed in hard-mask aligners.

Figure 2:
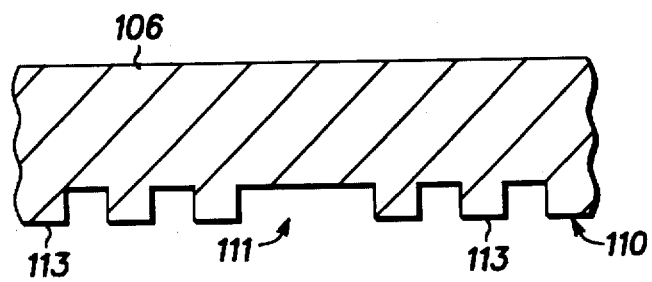
FIG. 2 is a partial, enlarged view of a stamping surface of a flexible stamp within the apparatus of FIG. 1.

Referring now to FIG. 2 there is depicted an enlarged cross-sectional view of stamping surface 110 includes a plurality of contacting surfaces 113 which define a predetermined pattern to be transferred, or stamped, onto surface 101 of article 102. Due to the elasticity and/or local strain of flexible stamp 106, runout or a local deformation 111 may occur. In this particular embodiment, the predetermined pattern includes equal spacing between plurality of contacting surfaces 113, and local deformation 111 includes a larger spacing. By compressing or stretching flexible stamp 106 at the appropriate locations, the predetermined pattern is restored. Mechanical attachments can be provided with the appropriate detection and control elements to provide this correction when required. Suitable elements will be known to those skilled in the art.

Figure 3:
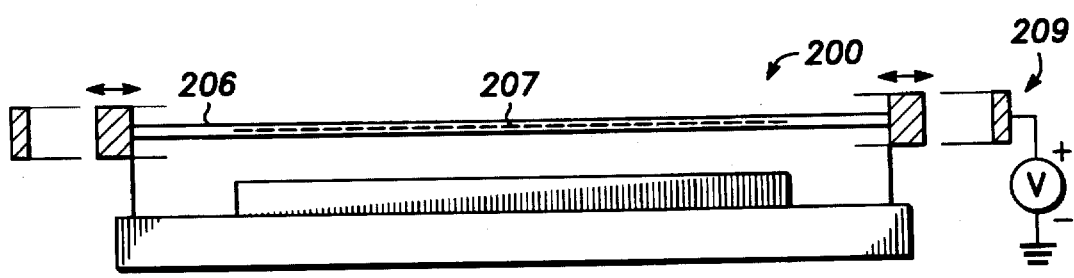
FIG. 3 is a side elevational view of another embodiment of an apparatus for stamping a surface of an article in accordance with the present invention.
Figure 4:
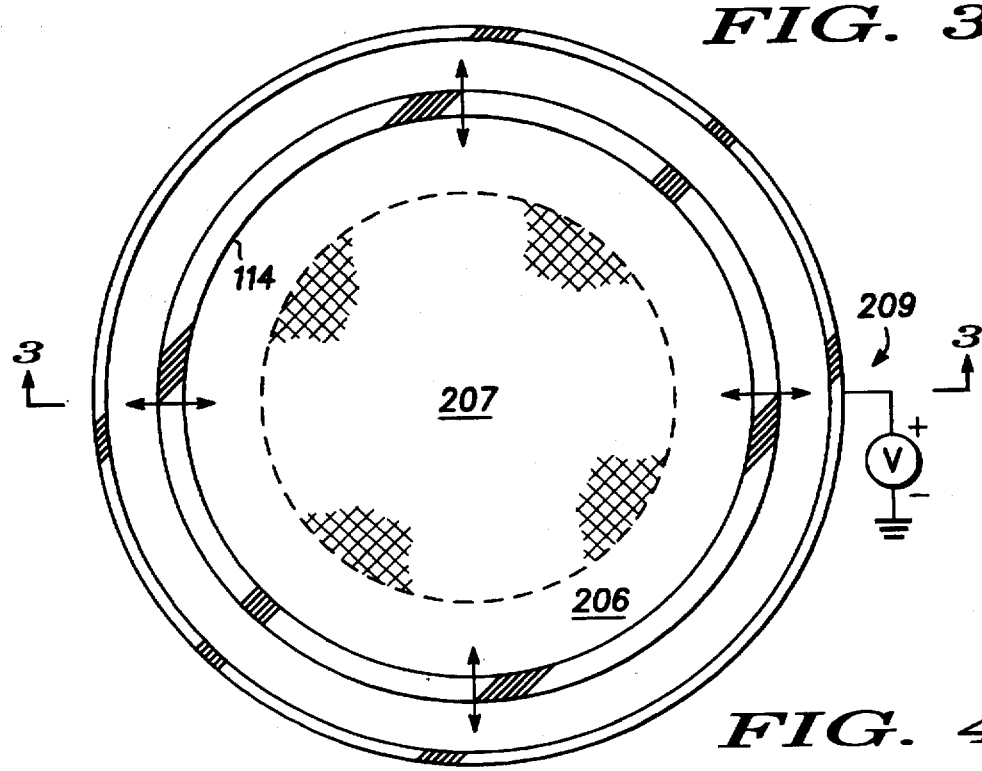
FIG. 4 is a top plan view of the apparatus of FIG. 3.

Referring now to FIGS. 3 and 4 there are depicted cross-sectional and top plan views, respectively, of another embodiment of an apparatus 200 for stamping a surface of an article including a flexible stamp 206 which has a plurality of piezoelectric crystals defining a disc 207. Disc 207 is operatively coupled to a voltage source 209 to provide corrective deformation as described above with reference to FIG. 2. When the appropriate voltage is applied around disc 207, the plurality of piezoelectric crystals are attracted toward or repelled from the applied voltage thereby stretching or compressing, respectively, flexible stamp 206. In this manner, distortions of the predetermined pattern, due to runout and/or local deformations of flexible stamp 206, can be corrected. Other means for correcting pattern distortions will occur to those skilled in the art.

Figure 5:
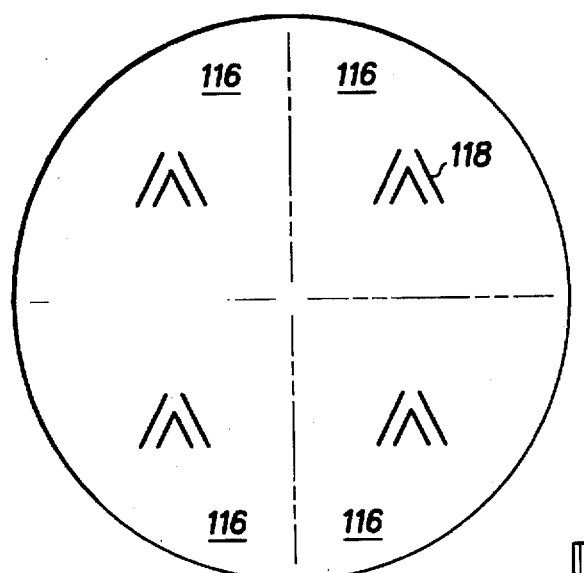
FIG. 5 is a top plan view of an embodiment of a flexible stamp having alignment patterns in accordance with the present invention.

Referring now to FIG. 5, there is depicted a top plan view of flexible stamp 100 further including a plurality of local alignment fields 116 and a plurality of alignment patterns 118. Flexible stamp 100 is effectively divided into plurality of local alignment fields 116, each of which contain alignment pattern 118 so that each local alignment field 116 can be individually aligned with a corresponding alignment pattern on article 102. This local alignment provides correction for local deformation. Additionally, plurality of local alignment fields 116 are included so that the nature of an overall deformation can be ascertained and corrected. For prior art rigid masks, two alignment patterns are sufficient to correct for x-y and angular displacements of the mask pattern with respect to the article pattern. The provision of only two alignment patterns is insufficient for aligning flexible stamp 106 with article 102.

Figure 6:
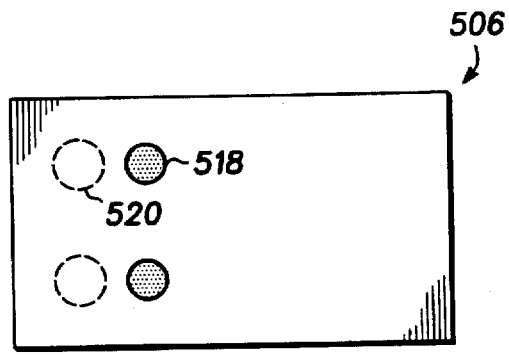
FIG. 6 is a top plan view of a schematic representation of a plurality of alignment patterns on a flexible stamp and on an article.
Figure 7:
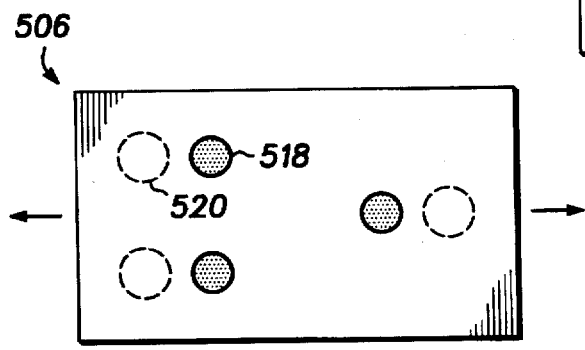
FIG. 7 is a top plan view of a schematic representation of another embodiment of an apparatus for stamping a surface of an article including a plurality of alignment patterns on a flexible stamp and on the surface of the article in accordance with the present invention.

To demonstrate the nature of this insufficiency, FIGS. 6 and 7 depict top plan views of a flexible stamp 506 having two alignment patterns 518 (FIG. 6) and three alignment patterns 518 (FIG. 7). Also illustrated are the corresponding alignment patterns 520 on article 102. An interpretation of the misalignment of patterns 518 and 520 in FIG. 7 reveals that stamp 506 needs to be stretched in order to bring alignment patterns 118 into registration, or alignment, with alignment patterns 520. If only two alignment patterns are used, under the same circumstances, as depicted in FIG. 6, an interpretation of the misalignment of FIG. 6 can be that stamp 506 requires displacement to the left in order to achieve registration between alignment patterns 518 and alignment patterns 520. With too few alignment patterns, or fields, the nature of the distortion may not be properly ascertained. Having too few local alignment fields, or pairs of alignment patterns, over the area of the stamp may not reveal the nature of the misalignment. It may be possible that an observed misalignment is attributable to either overall stamp misalignment (the correction of which requires changing stamp position, but not deformation of the stamp) or stamp deformation, such as bowing (the correction of which requires only stamp deformation). To provide the appropriate correction, multiple pairs of alignment patterns are included. The number of local alignment fields 116 and alignment patterns 118 increases as the area and flexibility of stamp 106 increases. As explained previously, prior art mask aligner do not provide multiple alignment patterns, the number of which increases with mask area. This is because the alignment of the rigid mask can be sufficiently accomplished with one or two pairs of alignment patterns. Especially when printing large-area surfaces having surface areas greater than about one square inch, a plurality of pairs of alignment patterns are required. The area of individual local alignment fields 116 will depend on the mechanical properties of the stamp.

Figure 8:
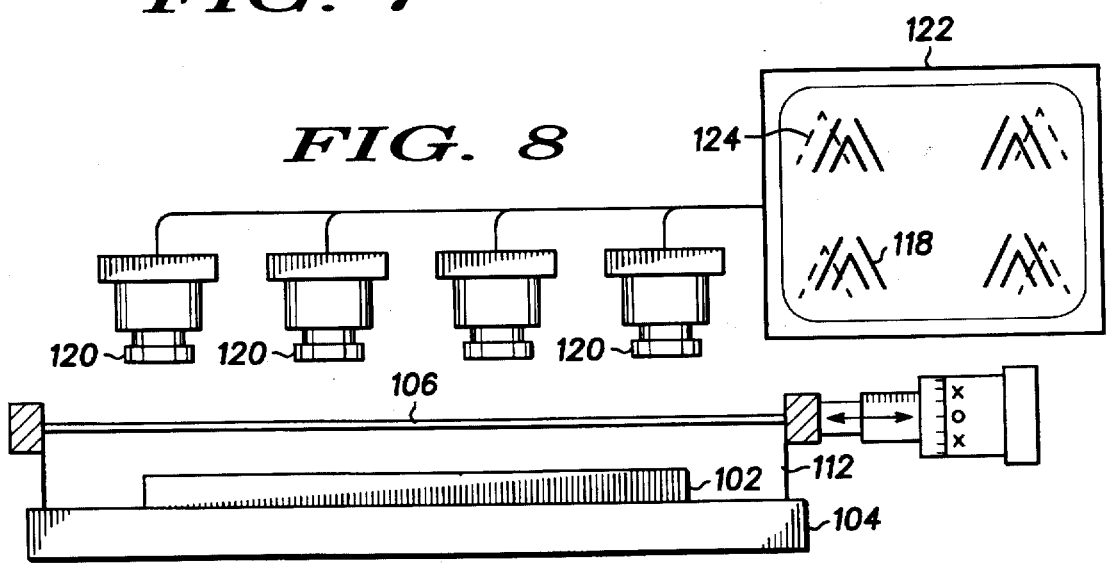
FIG. 8 is a side elevational view of another embodiment of an apparatus for stamping a surface of an article in accordance with the present invention.
Figure 9:
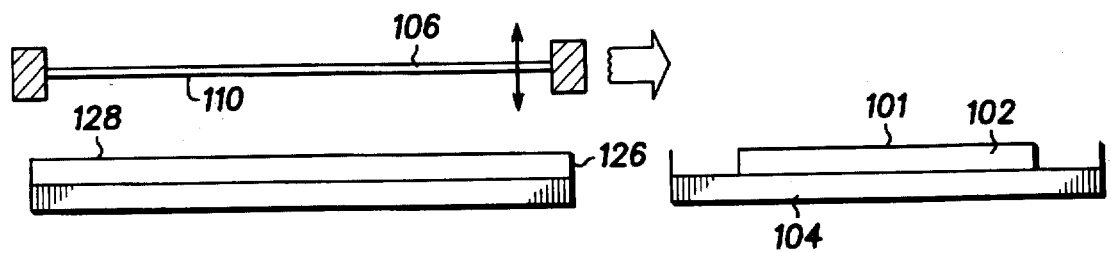
FIG. 9 is a side elevational view of another embodiment of an apparatus for stamping a surface of an article in accordance with the present invention.

Referring now to FIG. 8, there is depicted a side-elevational view of apparatus 100 further including a plurality of microscopes 120 in accordance with the present invention. In this particular embodiment, flexible stamp 106 is optically transparent so that a plurality of alignment marks 124 located on article 102 can be viewed through flexible stamp 106 with microscopes 120. Microscopes 120 are provided one per local alignment field 116 are employed so that the simultaneous alignment of plurality of local alignment fields 116 can be attained and verified, such as on a video monitor 122. Other types of alignment detectors may occur to one skilled in the art in accordance with the present invention.

Figure 10:
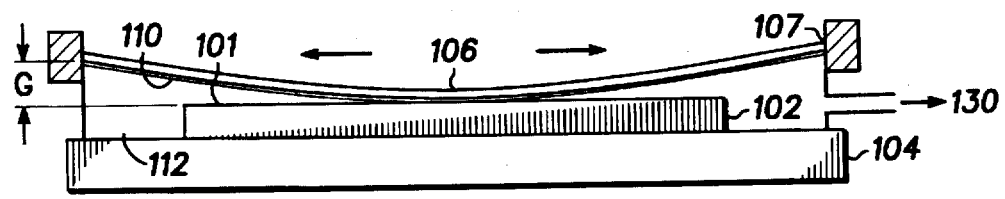
FIGS. 10-12 are side elevational views of the structures realized when the structure of FIG. 1 is utilized in accordance with an embodiment of a method for stamping a surface of an article in accordance with the present invention.
Figure 11:
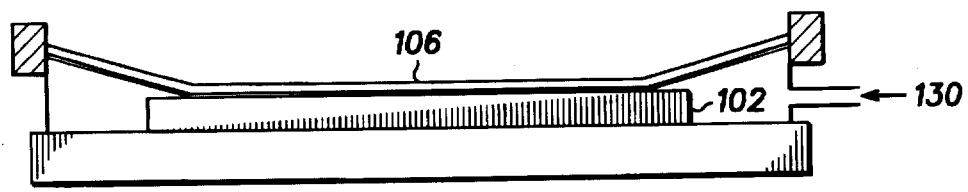
Figure 12:
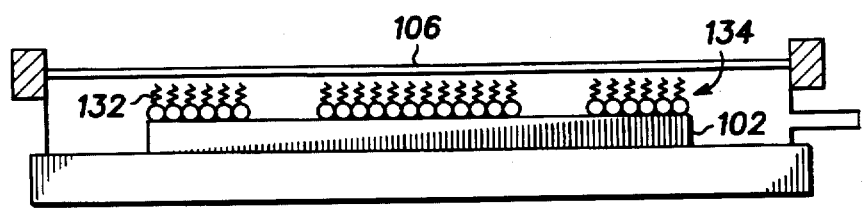

Referring now to FIGS. 9–12 there are depicted side-elevational views of apparatus 100 as used in an embodiment of a method for stamping a surface of an article in accordance with the present invention. In this particular embodiment, stamping surface 110 is first wetted with a fluid including a solution of a SAM-forming molecular species. This is done by providing a sponge-like substrate 126 having a surface 128 which is saturated with the fluid. Sponge-like substrate 126 is positioned outside first pressure-controlled chamber 112. Surface 128 has an area at least equal to the area of stamping surface 110 so that surface 128 can receive stamping surface 110. Stamping surface 110 of flexible stamp 106 is then contacted with surface 128 thereby wetting stamping surface 110 with the solution. Then, flexible stamp 106 is positioned over article 102 so that surface 101 opposes stamping surface 110. FIGS. 10–12 depict the step of controllably contacting stamping surface 110, now wetted, with surface 101 of article 102 so that a SAM 134 (FIG. 12), having the predetermined pattern of stamping surface 110, is formed on surface 101. Prior to the step of controllably contacting stamping surface 110, plurality of alignment patterns 118 on flexible stamp 106 are aligned with plurality of alignment patterns 124 on article 102. Alignment indicated that flexible stamp 106 is positioned so that the predetermined pattern of flexible stamp 106 can be printed onto surface 101 in a predetermined orientation relative to surface 101. This alignment step can include deforming flexible stamp 106, as described in greater detail with reference to FIGS. 1–7. Flexible stamp 106 is positioned so that stamping surface 110 is in close proximity to surface 101 thereby forming a printing gap having a height, G, between stamping surface 110 and surface 101. The printing gap, G, is about 100 micrometers. Flexible stamp 106 is immovably secured at its edges 107. An inert gas 130 is provided within pressure-controlled chamber 112 so that, initially, the pressure within pressure controlled chamber 112 is sufficient to maintain the printing gap. Then, the pressure within pressure-controlled chamber 112 is reduced by removing inert gas 130 in a controlled manner, which is schematically represented by the arrow in FIG. 10 showing inert gas 130 exiting pressure-controlled chamber 112. The pressure is reduced at a predetermined rate so that contact between stamping surface 110 and surface 101 of article 102 commences substantially at the center of flexible stamp 106 and proceeds outwardly away from the center (as depicted by the arrows above flexible stamp 106 in FIG. 10) in a controlled fashion thereby preventing undesired entrapment of inert gas 130 between stamping surface 110 and surface 101. After the desired extent of contact between surface 101 and stamping surface 110 has been achieved, flexible stamp 106 is removed from article 102 by adding inert gas 130 to pressure-controlled chamber 112 at a controlled rate and in a continuous manner so that flexible stamp 106 peels off surface 101 without distorting the predetermined pattern of the layer of fluid. In this particular embodiment, and as illustrated in FIG. 12, SAM 134, which includes a plurality of SAM-forming molecular species, is formed, and remains, on surface 101 and has the predetermined pattern of stamping surface 110, which is shown in exaggeration in FIG. 12.

The alignment pressure and printing pressure between a hard mask and wafer of a prior art contact printer/aligner are between about 0–500 mm Hg. The vapor pressure of a given SAM solution, at the temperature of the stamp, may be relatively high, when compared to this range of alignment and/or printing pressures. If contact between flexible stamp 106 and article 102 is achieved by lowering the pressure between flexible stamp 106 and article 102, the pressure required to provide the desired contact may be sufficiently low so as to result in undesired vaporization of the SAM solution. In this particular method, the pressure gradient across the stamp varies because, as the contacting proceeds from the center outward, the pressure is decreased continuously to provide the controlled contact. This varying pressure gradient may result in nonuniformities in the printing conditions (and, therefore, in the printed pattern) as the printing proceeds. That is, vapor pressures and solution content on the surface of the flexible stamp vary with position on the stamp/article. In these situations, when the properties of the SAM-forming solution/molecular species require it, it is desirable to maintain a constant, predetermined pressure between the flexible stamp and the article throughout the contacting process, as contact proceeds from the center of the stamp, outward. Such a function is provided by an embodiment of an apparatus for stamping a surface in accordance with the present invention and described below with reference to FIGS. 13 and 14.

Figure 13:
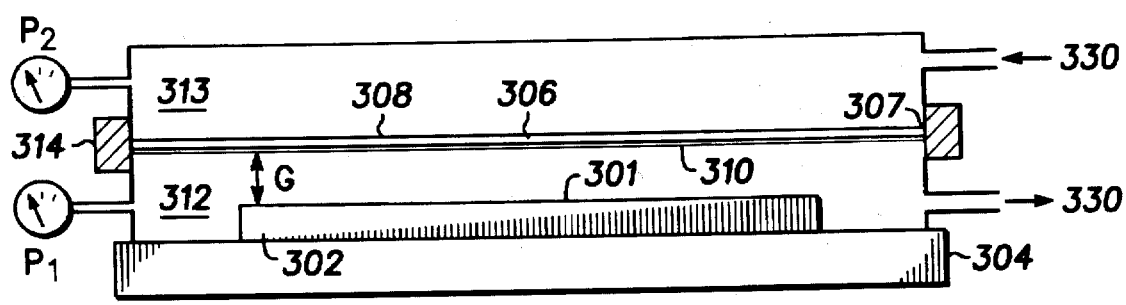
FIG. 13 is a side elevational view of another embodiment of an apparatus for stamping a surface of an article in accordance with the present invention.
Figure 14:
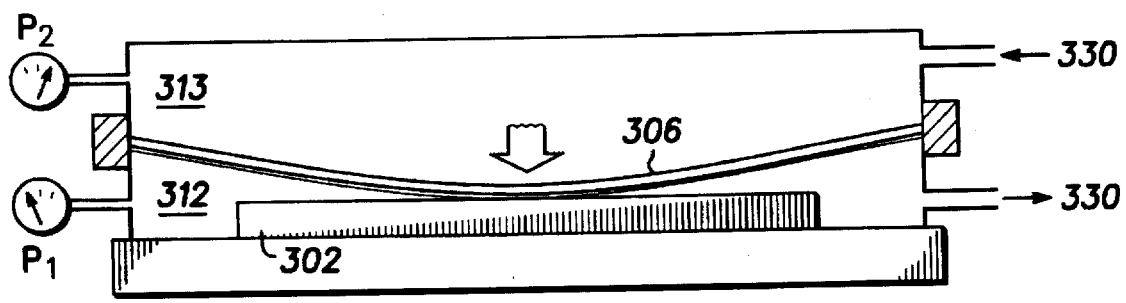
FIG. 14 is a side elevational view of the structure of FIG. 13 being utilized according to an embodiment of a method for stamping a surface of an article in accordance with the present invention.

Referring now to FIG. 13, there is depicted a side elevational view of another embodiment of an apparatus 300 for stamping a surface 301 of an article 302 in accordance with the present invention. A stamping surface 310 of a flexible stamp 306 is wetted with a solution containing a SAM-forming molecular species by, for example, a method such as that described with reference to FIG. 9. Apparatus 300 further includes a second pressure-controlled chamber 313, which is positioned above wetted flexible stamp 306 and in which is positioned an outer surface 308 of flexible stamp 306. Article 302 is positioned on a support structure 304 and within a first pressure-controlled chamber 312, so that a surface 301 of article 302 is directly opposed to stamping surface 310 of flexible stamp 306 which has a predetermined pattern to be printed on surface 301. Apparatus 300 is utilized in an embodiment of a method for stamping a surface of an article in accordance with the present invention. In this embodiment of the method, stamping surface 310 of flexible stamp 306 is positioned in close proximity to surface 301, so that a printing gap, G, of about 100 micrometers is established between stamping surface 310 and surface 301. Flexible stamp 306 is aligned with article 302 and immovably secured at edges 307 by a mechanical attachment 314. An inert gas 330 is provided within first pressure-controlled chamber 312 to define a first printing pressure, $P_1$. Inert gas 330 is also provided within second pressure-controlled chamber 313 to define a second printing pressure, $P_2$. As will be described in greater detail below, first printing pressure, $P_1$, and second printing pressure, $P_2$, establish a pressure differential across flexible stamp 306 which is manipulated to provide controlled contact between stamping surface 310 and surface 301 and to provide controlled pressure conditions within first pressure-controlled chamber 312. Initially, as illustrated in FIG. 13, the pressure differential across flexible stamp 306 is zero so that printing gap, G, is maintained. Then, second printing pressure, $P_2$, is increased in a controlled manner by adding inert gas 330 in a controlled manner (as indicated by the upper arrow of FIG. 13) while first printing pressure, $P_1$, is decreased in a controlled manner so that contact between stamping surface 310 and surface 301 commences substantially at the center of flexible stamp 306 and proceeds in a controlled manner outwardly from the center thereby preventing entrapment of inert gas 330 between stamping surface 310 and surface 301. The resulting configuration of apparatus 300 during this step is depicted in FIG. 14. First printing pressure, $P_1$, is maintained at a constant value by providing a suitable rate of removal of inert gas from pressure-controlled chamber 312, as indicated by the outward pointing arrow in FIGS. 13 and 14. In this manner the conditions within pressure-controlled chamber 312 are kept constant, and vaporization of the fluid is prevented, thereby ensuring uniform printing conditions throughout the printing process. The rate of increase of second printing pressure, $P_2$, can be a predetermined rate. After the desired extent of contact between surface 301 and stamping surface 310 is achieved, flexible stamp 306 is removed from article 302 in a controlled manner by simultaneously decreasing second printing pressure, $P_2$, by removing inert gas 330 from second pressure-controlled chamber 313, and maintaining the constant value of first printing pressure, $P_1$, by adding inert gas 330 to first pressure-controlled chamber 312 at an appropriate rate. This removal step is performed so that flexible stamp 306 peels off of surface 301 without distorting the predetermined pattern of the SAM which is formed on surface 301. The appropriate control schemes to provide the desired pressure control of first printing pressure, $P_1$, and second printing pressure, $P_2$, will occur to one skilled in the art.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

We claim:

1. An apparatus for stamping a surface of an article, the surface of the article having an alignment pattern, the apparatus comprising:

a support structure having a surface;

a first pressure-controlled chamber being disposed above the surface of the support structure;

a flexible stamp having an outer surface and having a stamping surface having a predetermined pattern, the flexible stamp being positioned above the support structure so that the stamping surface opposes the surface of the support structure, the stamping surface being disposed within the first pressure-controlled chamber, the support structure and the first pressure-controlled chamber being designed so that the article is positioned on the surface of the support structure and within the first pressure-controlled chamber and so that the surface of the article opposes the stamping surface;

means for controllably contacting the stamping surface with the surface of the article so that the predetermined pattern of the stamping surface is stamped onto surface of the article;

an alignment pattern positioned on the flexible stamp; and compensating means for compensating for runout and bowing of the flexible stamp which can distort the predetermined pattern of the stamping surface.

2. An apparatus for stamping a surface of an article as claimed in claim 1 wherein the compensating means includes radially deforming means for radially deforming the flexible stamp whereby the radially deforming means can stretch and compress the flexible stamp in a radial direction.

3. A method for stamping a surface of an article, the surface of the article having an alignment pattern, the method comprising the steps of:

providing a support structure having a surface;

providing a first pressure-controlled chamber disposed above the surface of the support structure;

providing a flexible stamp having edges, an outer surface, and a stamping surface including a predetermined pattern;

positioning the flexible stamp above the support structure so that the stamping surface opposes the surface of the support structure and so that the stamping surface is within the first pressure-controlled chamber;

placing the article on the surface of the support structure and within the first pressure-controlled chamber so that the surface of the article opposes the stamping surface;

wetting the stamping surface with a fluid;

controllably contacting the stamping surface with the surface of the article so that the predetermined pattern of the stamping surface is stamped onto the surface of the article;

providing an alignment pattern positioned on the flexible stamp; and prior to controllably contacting the stamping surface, aligning the alignment pattern of the article with the alignment pattern of the flexible stamp including the step of deforming the flexible stamp to compensate for runout and bowing of the flexible stamp which can distort the predetermined pattern of the stamping surface.

4. A method for stamping a surface of an article comprising the steps of:

providing a support structure having a surface;

providing a first pressure-controlled chamber disposed above the surface of the support structure;

providing a flexible stamp having edges, an outer surface, and a stamping surface including a predetermined pattern;

positioning the flexible stamp above the support structure so that the stamping surface opposes the surface of the support structure and so that the stamping surface is within the first pressure-controlled chamber;

placing the article on the surface of the support structure and within the first pressure-controlled chamber so that the surface of the article opposes the stamping surface;

wetting the stamping surface with a fluid;

controllably contacting the stamping surface with the surface of the article so that the predetermined pattern of the stamping surface is stamped onto the surface of the article;

defining at least three local alignment fields within the flexible stamp;

forming a first plurality of alignment patterns on the flexible stamp;

positioning the first plurality of alignment patterns one each in the local alignment fields;

forming a second plurality of alignment patterns on the surface of the article; and prior to controllably contacting the stamping surface, aligning the first plurality of alignment patterns with the second plurality of alignment patterns in a predetermined manner and including the step of deforming the flexible stamp to compensate for runout and bowing of the flexible stamp whereby alignment of the first plurality of alignment patterns with the second plurality of alignment patterns indicates that the flexible stamp is positioned so that the predetermined pattern of the flexible stamp can be printed onto the surface of the article in a predetermined orientation relative to the surface of the article.

5. A method for stamping a surface of an article as claimed in claim 4 wherein the step of compensating for runout and bowing of the flexible stamp includes the step of radially deforming the flexible stamp so that the flexible stamp is stretched or compressed in a radial direction.

6. A method for stamping a surface of an article comprising the steps of:

providing a support structure having a surface;

providing a first pressure-controlled chamber disposed above the surface of the support structure;

providing a flexible stamp having edges, an outer surface, and a stamping surface including a predetermined pattern;

positioning the flexible stamp above the support structure so that the stamping surface opposes the surface of the support structure and so that the stamping surface is within the first pressure-controlled chamber;

placing the article on the surface of the support structure and within the first pressure-controlled chamber so that the surface of the article opposes the stamping surface;

wetting the stamping surface with a fluid;

positioning the flexible stamp so that the stamping surface is in close proximity to the surface of the article thereby defining a printing gap between the stamping surface and the surface of the article;

immovably securing the flexible stamp at the edges;

providing within the first pressure-controlled chamber an inert gas having a pressure sufficient to maintain the printing gap between the stamping surface and the surface of the article; and thereafter reducing the pressure of the inert gas in a controlled manner so that contact between the stamping surface and the surface of the article commences substantially at the center of the flexible stamp and proceeds outwardly away from the center in a controlled fashion thereby preventing undesired entrapment of the inert gas between the surface of the article and the stamping surface thereby controllably contacting the stamping surface with the surface of the article so that the predetermined pattern of the stamping surface is stamped onto the surface of the article.

7. A method for stamping a surface of an article as claimed in claim 6 wherein the step of reducing the pressure of the inert gas includes reducing the pressure at a predetermined rate.

8. A method for stamping a surface of an article comprising the steps of:

providing a support structure having a surface;

providing a first pressure-controlled chamber disposed above the surface of the support structure;

providing a flexible stamp having edges, an outer surface, and a stamping surface including a predetermined pattern;

positioning the flexible stamp above the support structure so that the stamping surface opposes the surface of the support structure and so that the stamping surface is within the first pressure-controlled chamber;

placing the article on the surface of the support structure and within the first pressure-controlled chamber so that the surface of the article opposes the stamping surface;

wetting the stamping surface with a fluid;

providing a second pressure-controlled chamber disposed above the flexible stamp so that the outer surface of the flexible stamp is positioned in the second pressure-controlled chamber;

positioning the flexible stamp so that the stamping surface is in close proximity to the surface of the article thereby defining a printing gap between the stamping surface and the surface of the article;

immovably securing the flexible stamp at the edges;

providing an inert gas within the first pressure-controlled chamber to define a first printing pressure;

providing an inert gas within the second pressure-controlled chamber to define a second printing pressure whereby the first printing pressure and the second printing pressure establish a pressure differential across the flexible stamp; and controllably increasing the second printing pressure within the second pressure-controlled chamber so that contact between the stamping surface and the surface of the article commences substantially at the center of the flexible stamp and proceeds in a controlled manner outwardly thereby preventing entrapment of the inert gas between the stamping surface and the surface of the article thereby controllably contacting the stamping surface with the surface of the article so that the predetermined pattern of the stamping surface is stamped onto the surface of the article.

9. A method for stamping a surface of an article as claimed in claim 8 further including the step of, prior to the step of controllably increasing the second printing pressure within the second pressure-controlled chamber, providing an initial pressure differential of zero so that the printing gap is maintained between the stamping surface and the surface of the article.

10. A method for stamping a surface of an article as claimed in claim 8 wherein the step of controllably increasing the second printing pressure within the second pressure-controlled chamber includes increasing the second printing pressure at a predetermined rate.

11. A method for stamping a surface of an article as claimed in claims 8 further including the step of maintaining the first printing pressure at a constant value throughout the step of controllably increasing the second printing pressure within the second pressure-controlled chamber thereby preventing vaporization of the fluid from the stamping surface.

12. A method for stamping a surface of an article as claimed in claim 11 wherein the step of maintaining the first printing pressure at a constant value includes removing the inert gas from the first pressure-controlled chamber in a controlled manner.

* * * * *